United States Patent
Abbatiello et al.

(10) Patent No.: US 10,668,674 B2
(45) Date of Patent: Jun. 2, 2020

(54) APPARATUS AND METHOD FOR A HIGH PERFORMANCE CARBON FIBER LAMINATE ENCLOSURE PART FOR AN INFORMATION HANDLING SYSTEM

(71) Applicant: Dell Products L.P., Round Rock, TX (US)

(72) Inventors: Nicholas D. Abbatiello, Round Rock, TX (US); David W. Williams, Salado, TX (US)

(73) Assignee: Dell Products L.P., Round Rock, TX (US)

( * ) Notice: Subject to any disclaimer, the term of this patent is extended or adjusted under 35 U.S.C. 154(b) by 124 days.

(21) Appl. No.: 15/158,310

(22) Filed: May 18, 2016

(65) Prior Publication Data
US 2017/0334151 A1  Nov. 23, 2017

(51) Int. Cl.
*B29C 70/46* (2006.01)
*B29C 70/54* (2006.01)
(Continued)

(52) U.S. Cl.
CPC ........ *B29C 70/545* (2013.01); *B29C 35/0288* (2013.01); *B29C 37/0025* (2013.01);
(Continued)

(58) Field of Classification Search
CPC ....... B29L 2031/3481; B29L 2031/712; B29C 70/46; B29C 70/462; B29C 43/146;
(Continued)

(56) References Cited

U.S. PATENT DOCUMENTS 4,526,831 A * 7/1985 Hatchadoorian ..... B29C 43/203
428/300.7
4,855,011 A * 8/1989 Legge ..................... B29C 33/02
156/583.1
(Continued)

FOREIGN PATENT DOCUMENTS

CN  103894487 A * 7/2014
GB  2233275 A * 1/1991 ............. B29C 33/02
(Continued)

OTHER PUBLICATIONS

Definitions for "cooling". Merriam-Webster.com. Retrieved on Aug. 2, 2019 from https://www.merriam-webster.com/dictionary/cooling. (Year: 2019).*
(Continued)

*Primary Examiner* — Atul P. Khare
(74) *Attorney, Agent, or Firm* — Baker Botts L.L.P.

(57) ABSTRACT

An enclosure part for an information handling system is disclosed that may include materials formed together into a rectangular shape. The enclosure part may have a void on a core side and a flatness equal to or less than 0.5 mm. The materials may include a sheet of carbon fiber, a piece of non-woven carbon fiber, and a non-woven glass fiber. A method for manufacturing an enclosure part using through-plane temperature control may include inserting into a mold a sheet of carbon fiber and a piece of non-woven carbon fiber, heat pressing the sheet of carbon fiber with the piece of non-woven carbon fiber, and cooling a first portion of the mold including the sheet of carbon fiber and the piece of non-woven carbon fiber more quickly than a second portion of the mold including the sheet of carbon fiber, and removing the enclosure part from the mold.

12 Claims, 6 Drawing Sheets

(51) Int. Cl.

| | | |
|---|---|---|
| *B29C 70/08* | (2006.01) | |
| *B29C 37/00* | (2006.01) | |
| *B29C 35/02* | (2006.01) | |
| *B29C 43/14* | (2006.01) | |
| *B29C 43/18* | (2006.01) | |
| *B29L 31/34* | (2006.01) | |
| *B29C 35/16* | (2006.01) | |
| *B29K 69/00* | (2006.01) | |
| *B29K 105/00* | (2006.01) | |
| *B29K 105/08* | (2006.01) | |
| *B29K 105/12* | (2006.01) | |
| *B29K 309/08* | (2006.01) | |
| *B29K 307/04* | (2006.01) | |

(52) U.S. Cl.
CPC .......... *B29C 43/146* (2013.01); *B29C 43/183* (2013.01); *B29C 70/081* (2013.01); *B29C 70/088* (2013.01); *B29C 70/46* (2013.01); *B29C 35/02* (2013.01); *B29C 35/16* (2013.01); *B29K 2069/00* (2013.01); *B29K 2105/0881* (2013.01); *B29K 2105/128* (2013.01); *B29K 2105/253* (2013.01); *B29K 2105/256* (2013.01); *B29K 2307/04* (2013.01); *B29K 2309/08* (2013.01); *B29K 2313/00* (2013.01); *B29L 2031/3481* (2013.01)

(58) Field of Classification Search
CPC ..... B29C 43/147; B29C 43/18; B29C 43/183; B29C 43/184
See application file for complete search history.

(56) References Cited

U.S. PATENT DOCUMENTS

| | | | | |
|---|---|---|---|---|
| 4,925,615 | A * | 5/1990 | Willis | B29C 61/04 264/257 |
| 5,064,597 | A * | 11/1991 | Kim | B29C 33/02 249/135 |
| 5,158,132 | A * | 10/1992 | Guillemot | B29C 33/02 100/320 |
| 5,874,033 | A * | 2/1999 | Meeker | B29C 70/088 156/222 |
| 6,572,723 | B1 * | 6/2003 | Tilton | B29C 43/203 156/219 |
| 6,719,354 | B2 * | 4/2004 | Holt | E05D 1/02 16/225 |
| 8,173,238 | B2 * | 5/2012 | Okano | B29C 45/14311 428/60 |
| 8,268,226 | B2 * | 9/2012 | Vander Wel | B29C 43/36 264/257 |
| 8,911,651 | B2 * | 12/2014 | Muller | B29C 70/48 264/258 |
| 9,144,944 | B1 * | 9/2015 | White | B29C 35/0288 |
| 9,801,294 | B2 * | 10/2017 | Wang | H05K 5/0217 |
| 10,059,061 | B2 * | 8/2018 | Burns | B29C 64/386 |
| 2004/0112907 | A1 * | 6/2004 | Donnelly | B65D 90/022 220/660 |
| 2009/0117366 | A1 * | 5/2009 | Honma | B29C 70/086 428/314.8 |
| 2010/0086727 | A1 * | 4/2010 | Katayama | B29C 43/02 428/102 |
| 2010/0143648 | A1 * | 6/2010 | Tsai | B29C 45/14311 428/138 |
| 2010/0143650 | A1 * | 6/2010 | Tsai | B29C 66/304 428/139 |
| 2011/0017385 | A1 * | 1/2011 | Liu | B29C 33/424 156/196 |
| 2012/0280415 | A1 * | 11/2012 | Halford | B29C 35/0288 264/40.1 |
| 2014/0199515 | A1 * | 7/2014 | Oyabu | B32B 5/02 428/141 |
| 2014/0342119 | A1 * | 11/2014 | Kastell | B29C 43/146 428/141 |
| 2015/0004340 | A1 * | 1/2015 | Zhang | H05K 5/0243 428/36.1 |
| 2015/0224695 | A1 * | 8/2015 | Stensvad | B29C 45/73 264/40.6 |
| 2015/0266260 | A1 * | 9/2015 | Fujioka | B32B 3/30 428/118 |
| 2016/0001481 | A1 * | 1/2016 | Halford | B29C 33/04 264/327 |

FOREIGN PATENT DOCUMENTS

| | | | | |
|---|---|---|---|---|
| WO | WO-2009147265 A1 | * | 12/2009 | ............ B29C 33/02 |
| WO | WO-2014103711 A1 | * | 7/2014 | ............ B32B 3/30 |

OTHER PUBLICATIONS

Yoshizawa, Michael; Newton's Law of Cooling or Heating; UC Santa Barbara, Department of Mathematics; Oct. 3, 2012. (Year: 2012).*

"Surface Generation: A revolutionary heat-cool process for composite and injection moulding" at inside:technology 2015: edition 2, www.ttp.com, 5 pages.

* cited by examiner

APPARATUS AND METHOD FOR A HIGH PERFORMANCE CARBON FIBER LAMINATE ENCLOSURE PART FOR AN INFORMATION HANDLING SYSTEM

BACKGROUND

Field of the Disclosure

This disclosure relates generally to information handling systems and more particularly to enclosures with carbon fiber materials for information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

Advancements in packaging design have reduced both the weight and thickness of information handling systems. Moreover, advancements in display panels have increased the need for enclosures with tight tolerances and low deformation. Enclosure components included in information handling systems, such as laptops, notebooks, tablets, and portable displays, are the object of efforts to reduce weight and thickness while satisfying ever tightening tolerances and lower deformation specifications.

Conventional materials used for information handling system enclosures, such as for an outer shell of an information handling system, have typically included computerized numerical controlled (CNC) cutting of aluminum, which is costly and adds weight to the information handling system. Similar materials, such as magnesium, may suffer from manufacturing yield rate issues at currently desired small thicknesses and may not reduce weight sufficiently for information handling systems. Accordingly, it is desirable to have cost-effective materials and corresponding manufacturing methods for information handling system enclosures that yield lightweight and thin, yet sufficiently robust, enclosure parts.

SUMMARY

In one aspect, a disclosed method is for manufacturing an enclosure part for an information handling system. The enclosure part may be a high performance carbon fiber laminate. The method may include inserting a sheet of carbon fiber into a mold, inserting a piece of non-woven carbon fiber into the mold, and heat pressing the sheet of carbon fiber with the piece of non-woven carbon fiber using through-plane temperature control in the mold. The method may further include cooling a first portion of the mold including the sheet of carbon fiber and the piece of non-woven carbon fiber more quickly than a second portion of the mold including the sheet of carbon fiber using through-plane temperature control to form the enclosure part.

Other disclosed aspects include an enclosure part for an information handling system, including a plurality of materials formed together into a rectangular shape with a flatness equal to or less than 0.5 mm. The plurality of materials may include a sheet of carbon fiber, a piece of non-woven carbon fiber, and a non-woven glass fiber.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Information handling systems may demand ever thinner and lighter products, while supporting display panels that may demand ever smaller display bezels. Display panels may require that the enclosure parts for the information handling systems be rectangular in shape to accommodate the aspect ratio of the display panel. For example, a widescreen display panel may have an aspect ratio of 16:9 or greater. Although an aspect ratio of 16:9 is described, any aspect ratio suitable for use on an information handling system may be used for a rectangularly shaped enclosure part.

Display panels may lack adequate structural support and may be bonded with the enclosure of the information handling system to provide adequate support for mechanical and thermal stress. As information handling systems become widespread, lighter and thinner enclosure parts for information handling systems are increasingly desirable without sacrificing resistance to deformation and tolerance of the enclosure parts to support emerging display panels. In particular, lighter and lower cost alternatives to CNC aluminum enclosure parts are desired. As will be described in further detail, the inventors of the present disclosure have developed methods and structures disclosed herein for manufacturing enclosure parts for information handling systems. The disclosed enclosure parts may be thin and lightweight, while meeting expectations for deformation resistance and tolerance at a lower cost than CNC aluminum enclosure parts.

Particular embodiments are best understood by reference to FIGS. 1-6 wherein like numbers are used to indicate like and corresponding parts.

Figure 1:
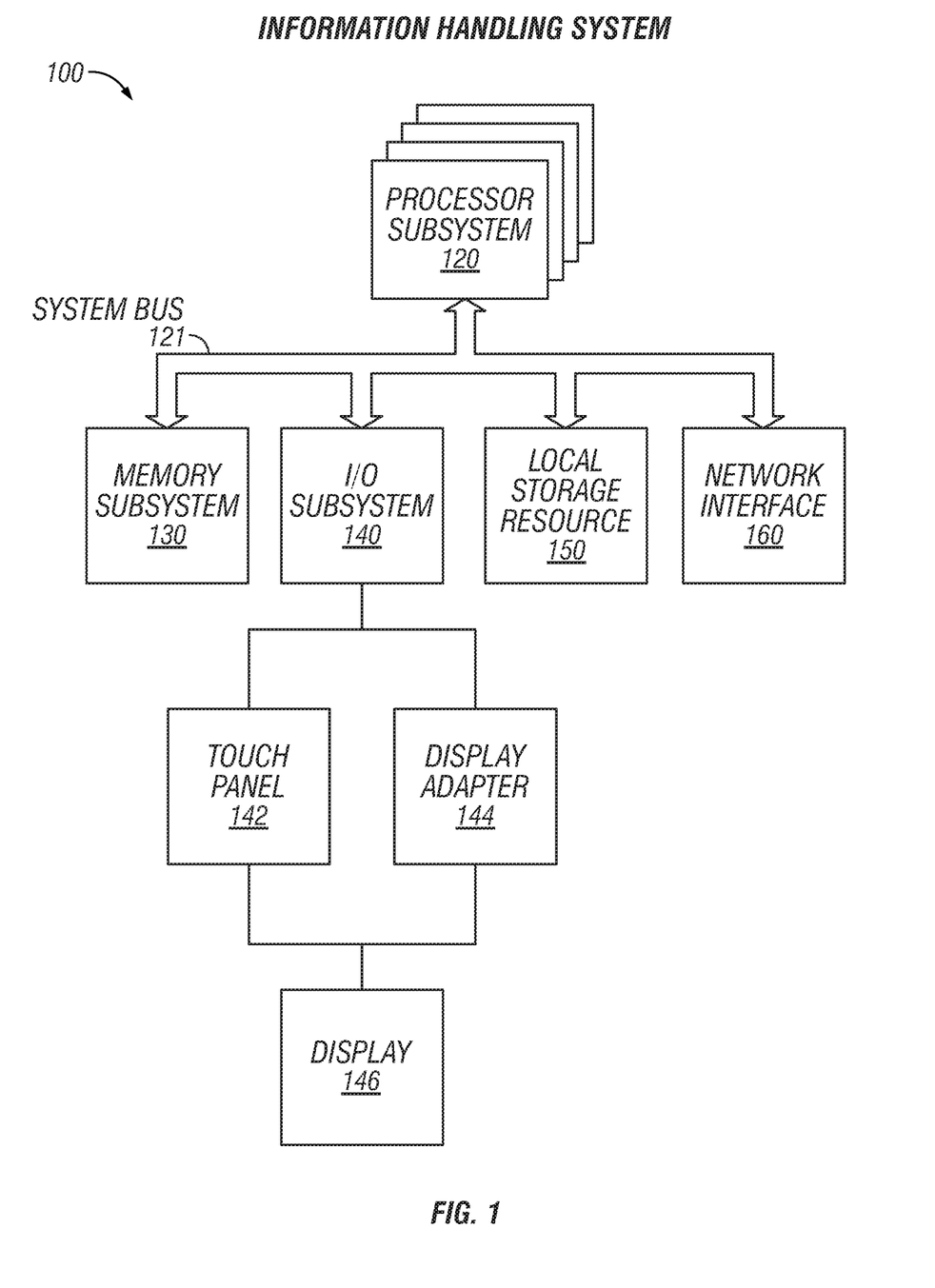
FIG. 1 is a block diagram of selected elements of an embodiment of an information handling system.

Turning now to the drawings, FIG. 1 illustrates a block diagram depicting selected elements of an embodiment of information handling system 100. As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, network storage resource 170 may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with display 146 that is driven by display adapter 144.

In particular embodiments, information handling system 100 may be any suitable computing device, including a laptop, notebook, netbook, and tablet computer, or any suitable mobile or wearable device, including a smart phone, smart watch, and mobile digital display. Typically, information handling systems are enclosed. As will be described in further detail, information handling system 100 may accordingly include one or more enclosure parts made of high performance carbon fiber laminate.

Traditional aluminum enclosures are typically made from aluminum billets that are extruded and milled using CNC machines. As noted, aluminum is a known material for enclosures. While aluminum may provide for tighter tolerances and low deformation, the cost and weight of an information handling system may be increased.

High performance carbon fiber laminate materials used for enclosure parts, as described herein, may reduce cost and weight while improving structural performance, in terms of low deformation, and manufacturing performance, in terms of tighter tolerances. To the extent that the aluminum increases weight, eliminating or limiting use of aluminum in information handling system enclosures may further reduce weight, which may be desirable.

Figure 2:
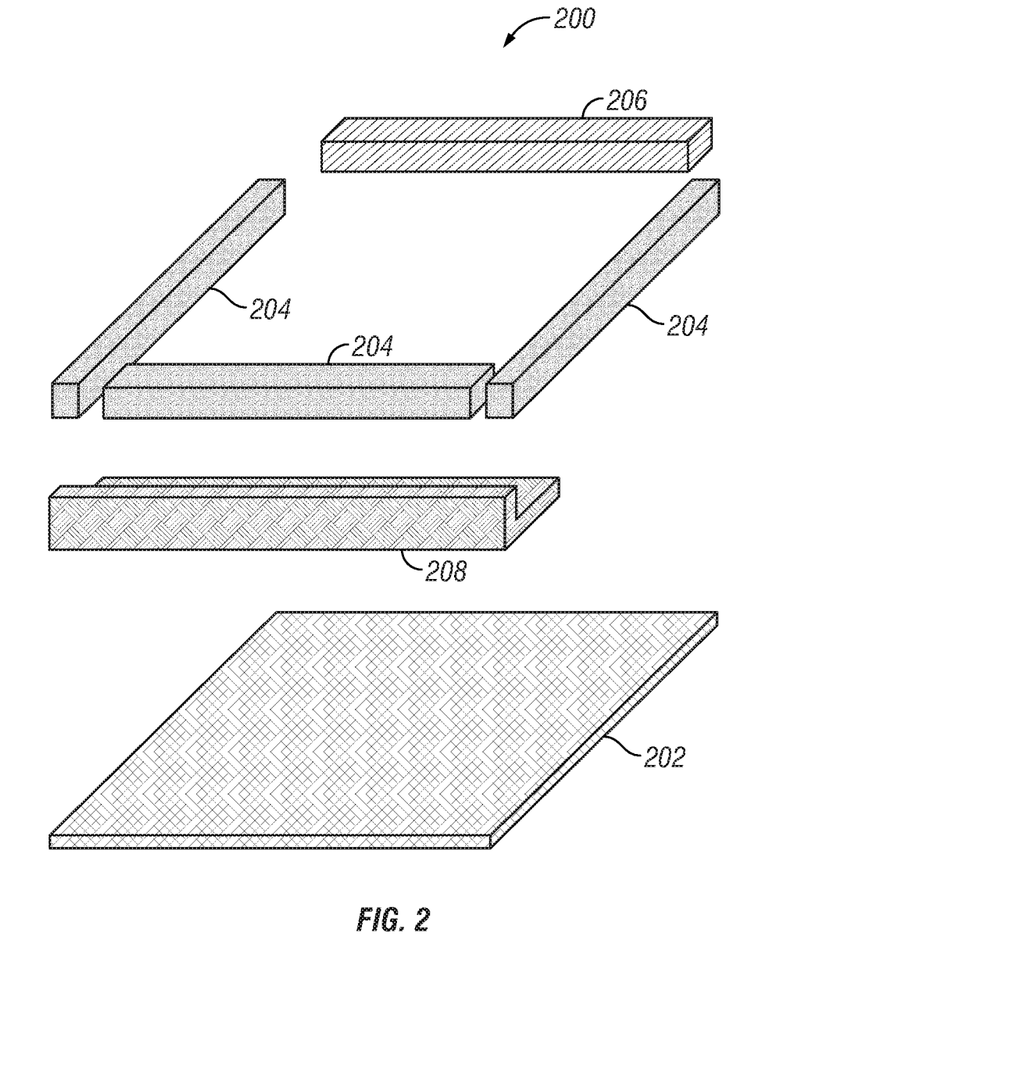
FIG. 2 is a block diagram of selected elements of an embodiment of a high performance carbon fiber laminate enclosure part.

Referring now to FIG. 2, a block diagram of selected elements of an embodiment of a high performance carbon fiber laminate enclosure part 200 is shown. The enclosure part may be made of thermoset carbon fiber or thermoplastic carbon fiber. Thermoplastic carbon fiber may enable higher manufacturing yields with the ability to reform the manufactured part, and may enable recycling or reuse of thermoplastic carbon fiber parts to reduce costs and/or environmental impact. Further, thermoplastic carbon fiber may be easier to form or mold than thermoset carbon fiber because the polymer, plastic, or resin in thermoplastic carbon fiber may flow more easily than the epoxy in thermoset carbon fiber. Thermoset carbon fiber may not flow easily causing gas traps, which may reduce the strength of the enclosure and/or negatively affect the appearance of the enclosure. Thermoplastic carbon fiber may use any suitable polymer, plastic, or resin for electronic devices, including polycarbonate, which may provide flame resistance for the enclosure.

Carbon fiber enclosures may use varying lengths of fibers in a woven or non-woven fashion. For example, short fibers may be shorter than 1 mm in length. Short fibers may be cheaper than long fibers, and may provide additional flexibility in manufacturing at the expense of reduced strength. As another example, long fibers may be shorter than 1 or 2 inches in length. Long fibers may be more expensive than short fibers, and may provide increased strength compared to short fibers. As a further example, continuous fibers may be several inches in length. Continuous fibers may be used across the length or height of an enclosure of an information handling system to provide additional strength at the expense of increased cost compared to long fibers. Non-woven fibers may provide better support for the polymer, plastic, or resin because the fibers may not be aligned in any particular direction, which may result in increased torsional rigidity and/or decreased deformation. Woven fibers may be cheaper than non-woven fibers at the expense of reduced torsional rigidity and/or increased deformation.

A high performance carbon fiber laminate enclosure part 200 may consist of a sheet of carbon fiber 202 and one or more pieces of non-woven carbon fiber 204. The two parts may use the same polymer, plastic, resin, or epoxy to mold or bond together using heat and/or pressure. The sheet of carbon fiber 202 may contain continuous fibers across the length or height of the part, and may be shaped or machined before placement in the mold. The display panel may have an aspect ratio greater than one, in which its width is greater than its height. With such a display panel, an enclosure part may include sheet of carbon fiber 202, which may have continuous fibers, oriented across the width of the enclosure part to provide additional strength for the information handling system. Non-woven carbon fiber 204 may be pre-impregnated with a polymer, plastic, resin, or epoxy, and may be shaped or machined before placement in the mold. Non-woven carbon fiber 204 may be used to provide additional support for a display panel to be affixed to the enclosure part. The sheet of carbon fiber 202 and the non-woven carbon fiber 204 may be thermoplastic or thermoset.

In another embodiment, the high performance carbon fiber laminate enclosure part 200 may include a sheet of carbon fiber 202, one or more pieces of non-woven carbon fiber 204, and a piece of non-woven glass fiber 206, which may include a matrix of non-continuous fibers. Sheet of carbon fiber 202 and one or more pieces of non-woven carbon fiber 204 may not permit wireless signals to pass through effectively and/or efficiently. Non-woven glass fiber 206 may be included in the high performance carbon fiber laminate enclosure part 200 to enable the enclosure to permit wireless signals to pass through effectively and/or efficiently. Wireless signals may include any suitable signal for an information handling system, including Wi-Fi, Bluetooth, NFC, and LTE. Non-woven glass fiber part 206 may include the same polymer, plastic, resin, or epoxy as the sheet of carbon fiber 202 and the non-woven carbon fiber 204.

In a further embodiment, the high performance carbon fiber laminate enclosure part 200 includes a sheet of carbon fiber 202, one or more pieces of non-woven carbon fiber 204, and a carbon fiber hinge 208. Carbon fiber hinge 208 may be non-woven. Further, carbon fiber hinge 208 may include the same polymer, plastic, resin, or epoxy as the sheet of carbon fiber 202 and the non-woven carbon fiber 204, such that carbon fiber hinge 208 may be molded or bonded between the sheet of carbon fiber 202 and the non-woven carbon fiber 204 without the use of a screw, bolt, or other fastener. Carbon fiber hinge 208 may be machined or cut to shape after being molded or bonded. Alternatively, carbon fiber hinge 208 may be machined or cut to shape before being molded or bonded and the mold may accommodate the machined or cut shape. Further, carbon fiber hinge 208 may be used to mount the high performance carbon fiber laminate enclosure part 200 to another enclosure part. In one embodiment, the information handling system may form a clamshell, in which high performance carbon fiber laminate enclosure part 200 forms one shell with a display panel and another shell houses an input device, such as a keyboard and/or touchpad. Carbon fiber hinge 208 may be used to mount the two shells of the clamshell together. In another embodiment, the information handling system may include a kickstand to support use of the information handling system in one or more configurations, including supporting the information handling system to stand upright. The kickstand may be mounted to the high performance carbon fiber laminate enclosure part 200 using the carbon fiber hinge 208.

The high performance carbon fiber laminate enclosure part 200 may have varying thicknesses to accommodate multiple pieces and/or materials. For example, a thick portion of the high performance carbon fiber laminate enclosure part 200 may include the thickness of both the sheet of carbon fiber 202 and the non-woven carbon fiber 204, and a thin portion of the high performance carbon fiber laminate enclosure part 200 may include the thickness of only the sheet of carbon fiber 202. Variations in thickness between the thick portion and the thin portion across the high performance carbon fiber laminate enclosure part 200 may result in uneven heating and cooling. Thicker sections of the high performance carbon fiber laminate enclosure part 200 may require additional heat from the mold to reach the same temperature within the material as thinner sections of the high performance carbon fiber laminate enclosure part 200. Further, thicker sections of the high performance carbon fiber laminate enclosure part 200 may require additional cooling from the mold to reach the same temperature within the materials as thinner sections of the high performance carbon fiber laminate enclosure part 200.

Although a particular information handling system enclosure part is shown and described, the following method of molding with through-plane temperature control may apply to any form of enclosure part for an information handling system that includes carbon fiber.

A traditional mold with in-plane temperature control may use one thermal element for each side of the mold. In-plane temperature control may apply a uniform temperature to the thermal element, which may result in different temperatures within the mold itself. The thermal elements may also be oriented parallel to the plane formed by the width and length of the material placed in the mold. Placing the high performance carbon fiber laminate enclosure part 200 of varying thickness into a traditional mold with in-plane temperature control may cause additional internal stresses within the high performance carbon fiber laminate enclosure part 200 resulting in additional deformation due to the uneven heating and cooling. For example, a thick portion of the performance carbon fiber laminate 200 may cool more slowly than a thin portion. Additional deformation, which may be caused by varying thickness, may exceed the acceptable limit of deformation for an enclosure part of an information handling system. For example, a flatness specification of 0.5 mm and/or an expectation of less than 20% yield loss from enforcement of the flatness specification may not be satisfied by a high performance carbon fiber laminate enclosure part 200 of varying thickness if the laminate is formed using traditional in-plane temperature control.

Figure 3:
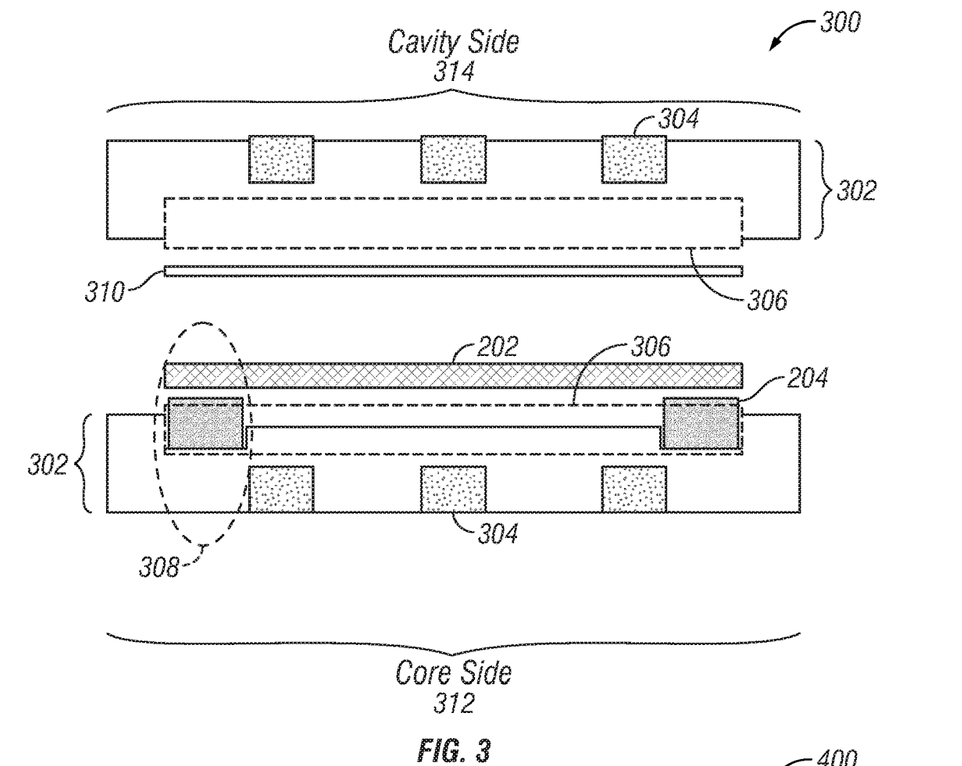
FIG. 3 is a side view of a block diagram of selected elements of an embodiment for creating a high performance carbon fiber laminate enclosure part.

Referring now to FIG. 3, a side view of a block diagram of selected elements of a mold 300 for creating a high performance carbon fiber laminate enclosure part is shown. The side view may represent a cross-sectional view of the mold. Each side of the mold 300 may contain a plurality of through-plane thermal elements 304 to control the temperature within the mold via heating and/or cooling. The plurality of through-plane thermal elements may be arranged in a grid or an array. Each through-plane thermal element 304 may be oriented orthogonally to the plane formed by the width and length of the material in the mold (e.g., sheet of carbon fiber 202). Greater control of the temperature may correspond to a greater density of thermal elements 304. Each through-plane thermal element may be individually controlled using heating and/or cooling via embedded heaters or coolers, or via water and/or refrigerant piped into the thermal element. A mold for creating a high performance carbon fiber laminate enclosure part using through-plane temperature control may apply non-uniform temperatures such that the temperature within the materials of varying thickness may be uniform. For example, while heating the materials in the mold, thinner portions of the mold may be held at lower temperatures than thicker portions of the mold, which may result in uniform temperatures within the materials in the mold. While cooling the materials in the mold, thinner portions of the mold may be held at higher temperatures thicker portions of the mold, which may result in reduced internal stress within the high performance carbon fiber laminate enclosure part, which may correspond to reduced deformation and/or increased flatness.

In contrast to through-plane temperature control, traditional in-plane temperature control may use only one heating element for each side of the mold to apply a temperature to the mold. Traditional in-plane temperature control may require additional manufacturing steps to mold each component into the enclosure part. Additional manufacturing steps, such as additional molding operations, may require additional processing time, which may increase the cycle time of each enclosure part if the processing capability of the manufacturing equipment is limited. Accordingly, through-plane temperature control may reduce cycle time compared to traditional in-plane temperature control by reducing the number of manufacturing steps required to create the enclosure part.

The mold may have two sides, which may be a cavity side 314 and a core side 312. The cavity side 314 and core side 312 may correspond to the two sides of the high performance carbon fiber laminate enclosure part or the sheet of carbon fiber. The base of the mold 302 may include thermal elements 304. The mold may include two bases 302, one for each side of the mold. Each side of the mold may include a void 306. The two voids may be the same or different. The non-woven carbon fiber 204 and the sheet of carbon fiber 202 may be placed in the mold before applying heat and/or pressure. Further, the non-woven carbon fiber 204 and the sheet of carbon fiber 202 may be pre-heated before placement in the mold 300. The carbon fiber pieces 202 and 204 may be placed such that a thick portion 308 may be formed within the mold. Alternatively, carbon fiber pieces 202 and 204 may be placed within a thick portion 308 that may have been formed within the mold. Thick portion 308 may include the thickness of the sheet of carbon fiber 202 and the non-woven carbon fiber 204. Thick portion 308 may be thicker than other portions, which may be referred to as thin portions, within void 306 of the mold 300. A thin portion may include only the thickness of the sheet of carbon fiber 202. For example, the sheet of carbon fiber 202 may be approximately 1.2 mm in thickness and the non-woven carbon fiber 204 may be approximately 2 mm in thickness. In that instance, thick portion 308 may be approximately 3.2 mm in thickness and a thin portion may be approximately 1.2 mm in thickness.

Through-plane heating and/or cooling may reduce the temperature in the thick portion 308 before other portions within the voids 306 to reduce deformation of the high performance carbon fiber laminate enclosure part. Moreover, this differential cooling may avoid uniform mold temperatures that may cool thick portions slower than thin portions of the mold, which may cause deformation. The high performance carbon fiber laminate enclosure part using through-plane temperature control may exhibit flatness equal to or less than 0.5 mm and/or a corresponding loss in yield from enforcing a flatness specification of less than 20%. Flatness may be measured in any suitable fashion including using a height gauge or an optical flat.

In one embodiment, a protective film 310 may be inserted into the mold. The protective film 310 may provide and/or transfer any suitable surface finish to a cavity side 314 of the high performance carbon fiber laminate enclosure part, including any combination of a sealant, dye, paint, texture, and/or surface features. The protective film 310 may be pre-heated before being placed in the mold.

The pieces of carbon fiber 202 and 204 may be shaped before insertion into the mold. The sheet of carbon fiber 202 may be cut or machined using CNC and the non-woven carbon fiber 204 may be die cut or water jet cut. Further, the high performance carbon fiber laminate enclosure part that emerges from the mold may be trimmed if needed. Additional features on the core side 312 of the high performance carbon fiber laminate enclosure part may be cut or machined using CNC. For example, the enclosure part may include a lip and/or bezel to accommodate the display panel of an information handling system. The lip and/or bezel may be cut or machined using CNC after the high performance carbon fiber laminate enclosure part emerges from the mold.

In another embodiment, the non-woven glass fiber 206 may be inserted into the mold. The non-woven glass fiber 206 may be pre-heated before being placed in the mold. Moreover, the non-woven glass fiber 206 may be cut or machined using CNC before or after being placed in the mold. In a further embodiment, a carbon fiber hinge 208 may be inserted into the mold. The carbon fiber hinge 208 may be pre-heated before being placed in the mold. Moreover, the carbon fiber hinge 208 may be cut or machined using CNC before or after being placed in the mold.

Figure 4:
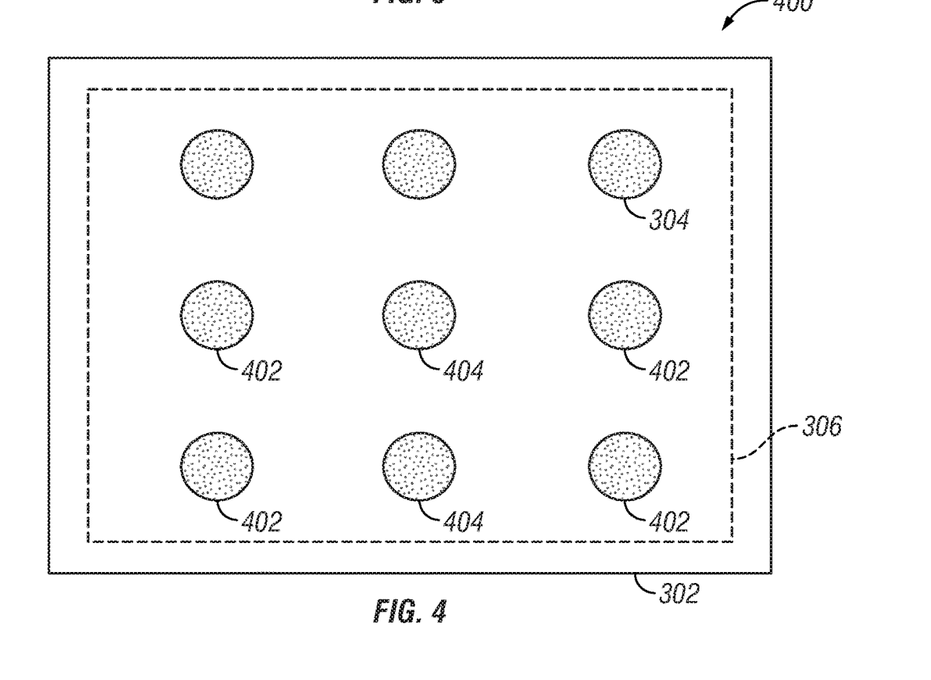
FIG. 4 is a vertical view of a block diagram of selected elements of an embodiment for creating a high performance carbon fiber laminate enclosure part using through-plane temperature control.

Referring now to FIG. 4, a vertical view of a block diagram of selected elements of an embodiment for creating a high performance carbon fiber laminate enclosure part using through-plane temperature control is shown. The vertical view of the mold 400 may include a base 302 of the mold, a plurality of thermal elements 304 for heating and/or cooling, and a void 306. Base 302 of the mold in FIG. 4 may correspond to base 302 of the mold in FIG. 3, and the plurality of thermal elements 304 in FIG. 4 may correspond to the plurality of thermal elements 304 in FIG. 3.

Thermal elements 304 may be arranged in a grid. The grid may have equal numbers of elements in each direction or may have more elements on one direction than another. The grid may also be arranged with a uniform distance between elements, or a non-uniform distance between elements. As illustrated, thermal elements 402 may be placed along the base 302 and may correspond to thick portions of the void and thermal elements 404 may be placed along the base 302 and may correspond to thin portions of the void. Additional thermal elements may be placed in a thick portions, such as thick portion 308, or along a boundary between a thick and thin portions to provide more accurate temperature control. More accurate temperature control may improve the flatness or deformation of the high performance carbon fiber laminate enclosure part. Each element may be independently heated and/or cooled to provide precise temperature control of a given area. Although nine thermal elements are shown, any number of thermal elements may be used suitable for though-plane temperature control to form a high performance carbon fiber laminate enclosure part. A higher density of elements, for example, may result in more accurate or fine-grained temperature control.

Figure 5A:
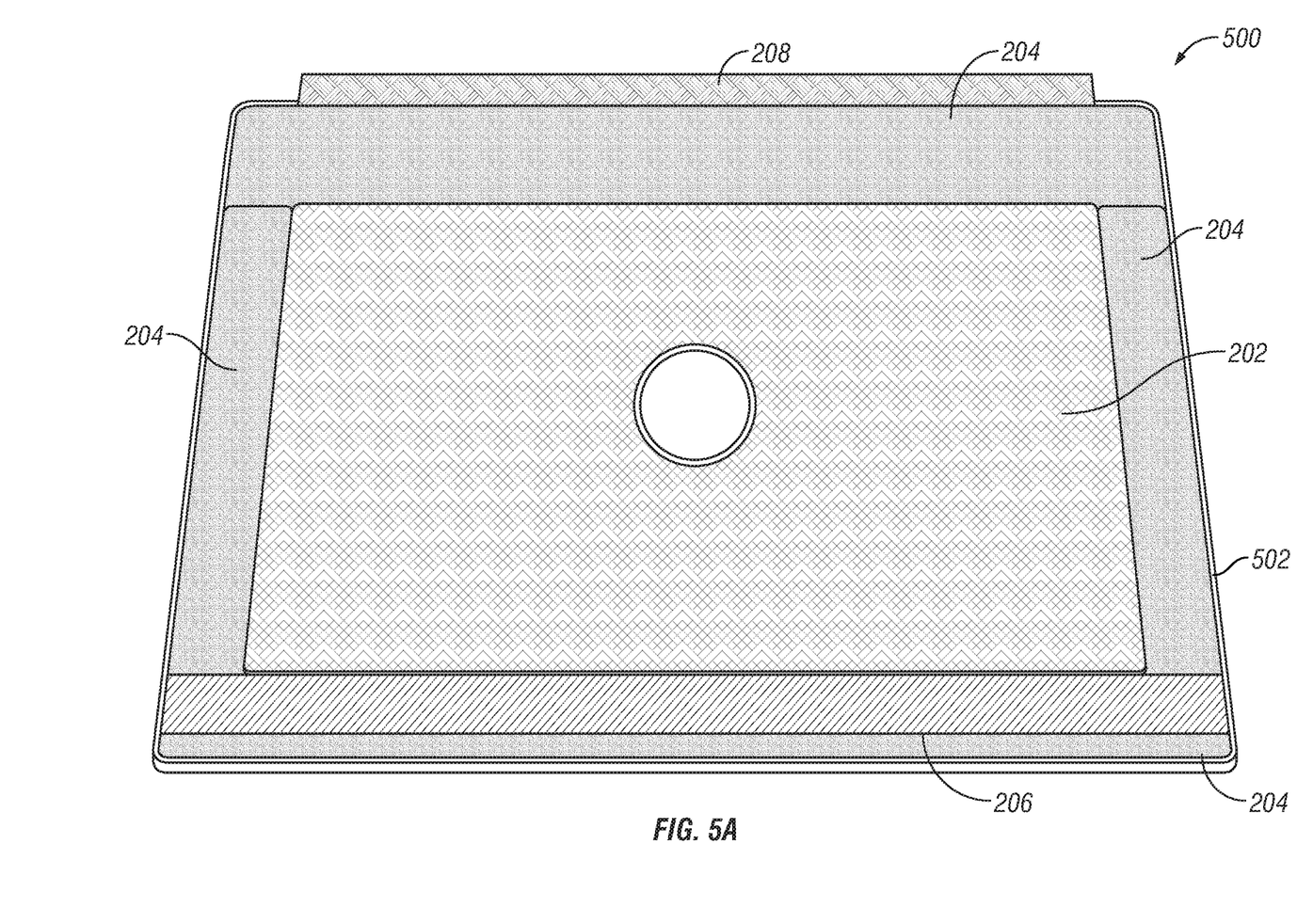
FIG. 5A is a core side view of a block diagram of selected elements of an embodiment of a high performance carbon fiber laminate enclosure part.

Referring now to FIG. 5A, a core side view of a block diagram of selected elements of an embodiment of a high performance carbon fiber laminate enclosure part 500 is shown. The core side of the enclosure part may accept a display panel. The high performance carbon fiber laminate enclosure part 500 may include sheet of carbon fiber 202, non-woven carbon fiber 204, non-woven glass fiber 206, and carbon fiber hinge 208. Sheet of carbon fiber 202 in FIG. 5 may correspond to sheet of carbon fiber 202 in FIG. 2; non-woven carbon fiber 204 in FIG. 5 may correspond to non-woven carbon fiber 204 in FIG. 2; non-woven glass fiber 206 in FIG. 5 may correspond to non-woven glass fiber 206 in FIG. 2; and carbon fiber hinge 208 in FIG. 5 may correspond to carbon fiber hinge 208 in FIG. 2. High performance carbon fiber laminate enclosure part 500 may be machined to form a lip or bezel 502. A display panel may be placed in the void formed by the lip 502 and bonded to the core side of the high performance carbon fiber laminate enclosure part 500. After bonding, lip 502 may then form a bezel around the display panel.

Figure 5B:
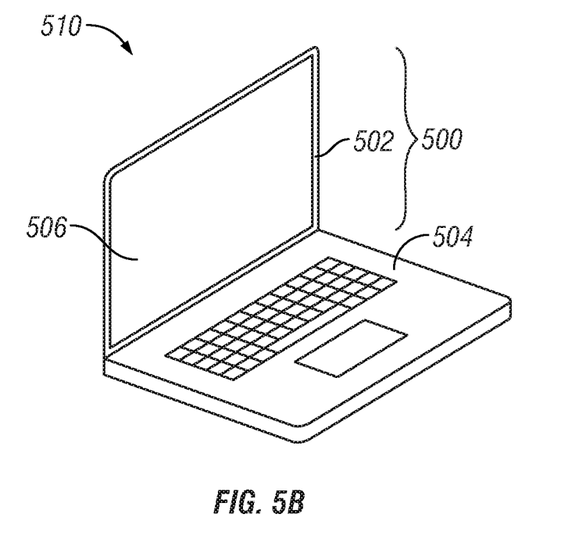
FIG. 5B is a block diagram of selected elements of an embodiment of an information handling system with a high performance carbon fiber laminate enclosure part.

Referring now to FIG. 5B, a block diagram of selected elements of an embodiment of an information handling system with a high performance carbon fiber laminate enclosure part is shown. The information handling system may have two enclosure parts forming a clamshell. One side of the shell may be high performance carbon fiber laminate enclosure part 500 and the other side of the shell may be enclosure part 504. Display panel 506 may be mounted in or affixed to high performance carbon fiber laminate enclosure part 500 with a bezel 502. The thickness of bezel 502 may be substantially less than the thickness of high performance carbon fiber laminate enclosure part 500 or enclosure part 504.

Figure 5C:
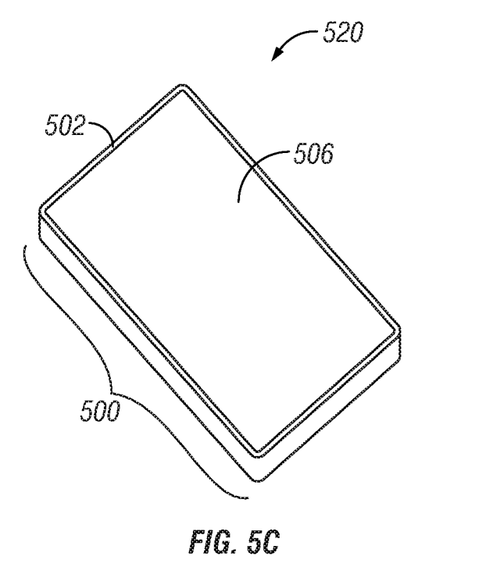
FIG. 5C is a block diagram of selected elements of an embodiment of an information handling system with a high performance carbon fiber laminate enclosure part.

Referring now to FIG. 5C, a block diagram of selected elements of an embodiment of an information handling system with a high performance carbon fiber laminate enclosure part 500 is shown. The information handling system may have only one enclosure part, which may be high performance carbon fiber laminate enclosure part 500. The enclosure part may be a high performance carbon fiber laminate enclosure part 500, which may surround display panel 506 and form bezel 502. The thickness of bezel 502 may be substantially less than the thickness of high performance carbon fiber laminate enclosure part 500. In one embodiment, the information handling system may lack a hinge based on having only one enclosure part. In another embodiment, the information handling system may include a hinge to mount the enclosure part to a kickstand for support of the information handling system.

Figure 6:
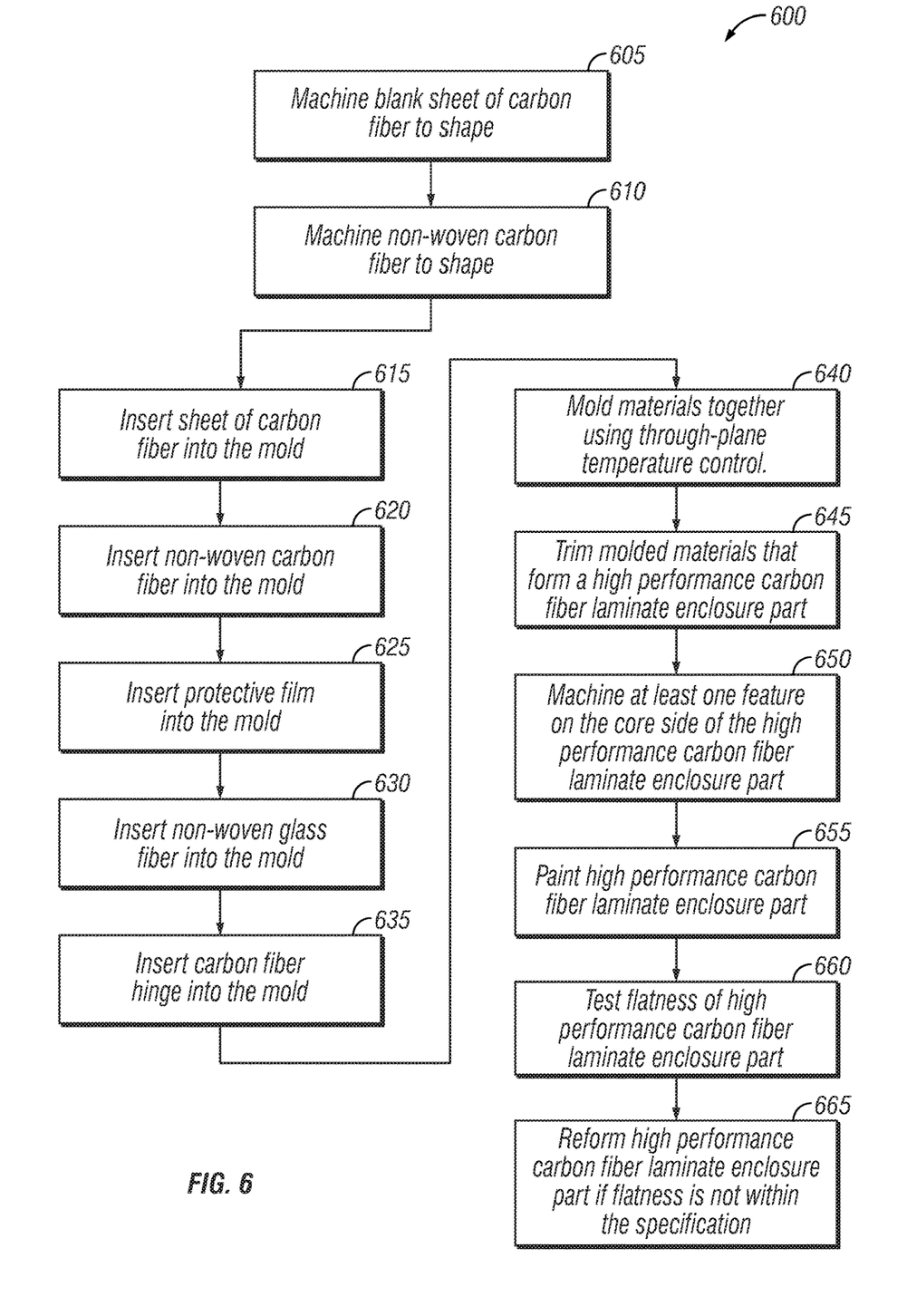
FIG. 6 is a block diagram of selected elements of an embodiment of a method for creating high performance carbon fiber laminate enclosure part.

Referring now to FIG. 6, a block diagram of selected elements of an embodiment of a method for creating high performance carbon fiber laminate enclosure part is shown, in accordance with embodiments of the present disclosure. Method 600 may be implemented by any of the elements shown in FIGS. 1-5. Method 600 may be initiated by any suitable criteria and may initiate operation at any suitable point. In one embodiment, method 600 may initiate operation at 505. Method 500 may include greater or fewer steps than those illustrated. Moreover, method 600 may execute its steps in an order that is different than those illustrated below. Method 600 may terminate at any suitable step. Moreover, method 600 may repeat operation at any suitable step. Portions of method 600 may be performed in parallel and repeat with respect to other portions of method 600.

At 605, a blank sheet of carbon fiber may be cut or machined to shape, which may involve CNC. In one embodiment, the blank sheet of carbon fiber may include multiple layers of carbon fiber placed in a laminate. In another embodiment, the blank sheet of carbon fiber may be a single layer of carbon fiber.

At 610, one or more pieces of non-woven carbon fiber may be cut or machined to shape. The shape of the non-woven carbon fiber may be different than the sheet of carbon fiber. The non-woven carbon fiber may be machined by any suitable process including die cutting and water jet cutting. The non-woven carbon fiber may include pockets of air before being placed in the mold.

At 615, the sheet of carbon fiber may be inserted into the mold. The sheet of carbon fiber may be pre-heated prior to operating the mold. Pre-heating may soften the sheet of carbon fiber and may enable the sheet of carbon fiber to be placed in the mold more easily and may increase yield by reducing the occurrence of defects.

At 620, the non-woven carbon fiber may be inserted into the mold. The non-woven carbon fiber may be pre-heated prior to operating the mold. Pre-heating may soften the non-woven carbon fiber and may enable the non-woven carbon fiber to be placed in the mold more easily and may increase yield by reducing the occurrence of defects.

At 625, a protective film may be inserted into the mold. The protective film may provide and/or transfer any suitable surface finish to the high performance carbon fiber laminate enclosure part, including any combination of a sealant, dye, paint, texture, and/or surface features for the information handling system enclosure part. The protective film may be pre-heated prior to operating the mold. Pre-heating may soften the protective film and may enable the protective film to be placed in the mold more easily and may increase yield by reducing the occurrence of defects.

At 630, a non-woven glass fiber may be inserted into the mold. The non-woven glass fiber may permit wireless signals to pass through the enclosure of the information handling system. The non-woven glass fiber may be pre-heated prior to operating the mold. Pre-heating may soften the non-woven glass fiber and may enable the non-woven glass fiber to be placed in the mold more easily and may increase yield by reducing the occurrence of defects.

At 635, a carbon fiber hinge may be inserted into the mold. The carbon fiber hinge may be placed between the sheet of carbon fiber and a piece of non-woven carbon fiber. The carbon fiber hinge may provide a mechanism for one enclosure part to mechanically couple with another enclosure part or kickstand. By inserting a carbon fiber hinge into the mold, additional fasteners to keep the hinge attached to the high performance carbon fiber laminate enclosure part may not be necessary. Accordingly, screws, bolts, or other fasteners may not be needed. The carbon fiber hinge may be pre-heated prior to operating the mold. Pre-heating may soften the carbon fiber hinge and may enable the carbon fiber hinge to be placed in the mold more easily and may increase yield by reducing the occurrence of defects.

Each of the materials added to the mold may be pre-heated to the same temperature, different temperatures, or any combination thereof.

At 640, the components are molded or heat pressed together using through-plane temperature control. Heat pressing may use any combination of heat and/or compression to mold the components together into an enclosure part. This form of heat pressing may remove pockets of air, which may be included in the non-woven carbon fiber. In one embodiment, the polymers, plastics, resins, or epoxies used are similar. This similarity may include having similar properties, including a similar melting point. In another embodiment, the polymers, plastics, resins, or epoxies used are the same. Through-plane temperature control may use non-uniform temperatures in the mold to heat thin portions of the components in the mold more slowly than thick portions of the components in the mold, which may result in a uniform heating within the components themselves. Through-plane temperature control may further use non-uniform temperatures in the mold to cool thick portions of the material more quickly than thin portions of the material, which may result in uniform cooling within the material itself. The result of through-plane temperature control may be reduced deformation and/or increased flatness of the high performance carbon fiber laminate enclosure part that emerges from the mold.

At 645, the high performance carbon fiber laminate enclosure part that emerges from the mold may be trimmed to remove excess material and/or to shape the material further for the information handling system.

At 650, the high performance carbon fiber laminate enclosure part may be cut or machined using CNC to add features to the core side of the high performance carbon fiber laminate enclosure part. The core side may refer to a side of the enclosure part that accepts a display panel. The features may enable precise fitting of a display panel into the enclosure part using any suitable cut or series of cuts, including bosses, lips, and undercuts.

At 655, the high performance carbon fiber laminate enclosure part may be painted. The paint may be any suitable color, including black and a clear-coat. The clear-coat paint may enable the fibers within the enclosure part to be visible. The paint may provide a protective finish for the surface of the enclosure part. Further, the painting may include adding a stencil to the surface of the enclosure part. In one embodiment, the painting may provide a texture to the surface of the enclosure part. In another embodiment, the painting may provide a matte finish to the surface of the enclosure part. In a further embodiment, the painting may provide a rubberized finish to the surface of the enclosure part, such as a soft-touch weave. The painting may be applied to the cavity side of the enclosure part and/or the core side of the enclosure part.

At 660, the high performance carbon fiber laminate enclosure part may be tested for flatness. Flatness may be measured in any suitable fashion including using a height gauge or an optical flat. The flatness specification may be 0.5 mm or less, which may correspond to the acceptable amount of deformation for the enclosure part. In one embodiment, the flatness specification may be adjusted based on the size of the lip surrounding the portion of the enclosure configured to accept a display panel. The lip may correspond in an assembled information handling system to the edge of the information handling system or the bezel surrounding the display panel on the information handling system. Accordingly, a small or near-invisible bezel as perceived by the user of an information handling system may require less deformation or a tighter specification for flatness to ensure proper construction of the enclosure for the information handling system.

At 665, the high performance carbon fiber laminate enclosure part may be reformed if the flatness is not sufficient. Reformation may include any suitable form, including stamping of the enclosure part. For example, the enclosure part may be heated and bent or stamped to correct the deformation and improve the flatness. A thermoplastic carbon fiber material may more easily be reformed than thermoset carbon fiber material, which may undergo a permanent chemical reaction during the molding process.

As disclosed herein, high performance carbon fiber laminate enclosure part may be used for an information handling system. The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for manufacturing an enclosure part for an information handling system, the method comprising:
   inserting a sheet of carbon fiber into a mold;
   inserting a piece of non-woven carbon fiber into the mold;
   heat pressing the sheet of carbon fiber with the piece of non-woven carbon fiber while using through-plane temperature control in the mold to control temperature orthogonal to a plane formed by the sheet of carbon fiber;
   cooling, while using the through-plane temperature control, a first portion of the mold including the sheet of carbon fiber and the piece of non-woven carbon fiber more quickly than a second portion of the mold including the sheet of carbon fiber, wherein the cooling forms a molded part;
   removing the molded part from the mold after the cooling of the first portion of the mold and the second portion of the mold; and
   forming the enclosure part from the molded part, wherein the forming comprises machining a lip on a core side of the molded part using an undercut.

2. The method of claim 1, wherein
   the sheet of carbon fiber is machined before being inserted into the mold; and
   the piece of non-woven carbon fiber is machined by at least one of: die cutting and water jet cutting before being inserted into the mold.

3. The method of claim 1, further comprising pre-heating the sheet of carbon fiber and the piece of non-woven carbon fiber before said heat pressing of the sheet of carbon fiber with the piece of non-woven carbon fiber, wherein the step of heat pressing further includes heating the first portion of the mold more quickly than the second portion of the mold.

4. The method of claim 1, further comprising inserting a protective film into the mold, wherein the step of heat pressing transfers a surface finish from the protective film to a cavity side of the molded part.

5. The method of claim 1, wherein the forming of the enclosure part further comprises trimming the molded part after said removing of the molded part from the mold.

6. The method of claim 1, wherein the forming of the enclosure part further comprises painting the molded part.

7. The method of claim 1, further comprising inserting a carbon fiber hinge into the mold between the sheet of carbon fiber and the piece of non-woven carbon fiber.

8. The method of claim 1, further comprising inserting a non-woven glass fiber into the mold to form a region of the molded part to permit wireless signals to pass, the region formed by said heat pressing and said cooling.

9. The method of claim 1, wherein the forming the enclosure part further comprises:
   measuring a flatness of the molded part;
   determining that the flatness of the molded part is not acceptable based on a comparison between the measured flatness of the molded part and a flatness threshold;
   heating the molded part having the unacceptable flatness; and
   stamping the molded part having the unacceptable flatness to improve the flatness of the molded part.

10. The method of claim 9, wherein the flatness threshold is 0.5 mm.

11. The method of claim 1, wherein the piece of non-woven carbon fiber is pre-impregnated with a first thermoplastic and the sheet of carbon fiber includes continuous fibers and a second thermoplastic.

12. The method of claim 11, wherein the first thermoplastic and the second thermoplastic are made from a common polymer, wherein the common polymer is polycarbonate.

* * * * *